United States Patent [19]
Takeuchi et al.

[11] Patent Number: 5,723,376
[45] Date of Patent: Mar. 3, 1998

[54] METHOD OF MANUFACTURING SIC SEMICONDUCTOR DEVICE HAVING DOUBLE OXIDE FILM FORMATION TO REDUCE FILM DEFECTS

[75] Inventors: Yuuichi Takeuchi, Chita; Takeshi Miyajima, Kariya; Kazukuni Hara, Obu; Norihito Tokura, Okazaki, all of Japan

[73] Assignee: Nippondenso Co., LTD., Kariya, Japan

[21] Appl. No.: 745,958

[22] Filed: Nov. 7, 1996

Related U.S. Application Data

[63] Continuation of Ser. No. 468,073, Jun. 6, 1995, abandoned.

[30] Foreign Application Priority Data

Jun. 23, 1994 [JP] Japan ................... 6-141393

[51] Int. Cl.$^6$ ............... H01L 21/265; H01L 21/44; H01L 21/48
[52] U.S. Cl. ........................... 438/270; 438/931
[58] Field of Search ................ 438/931, 268, 438/269, 270, 271

[56] References Cited

U.S. PATENT DOCUMENTS

| | | | |
|---|---|---|---|
| 4,767,722 | 8/1988 | Blanchard | 437/41 DM |
| 4,875,083 | 10/1989 | Palmour . | |
| 4,912,063 | 3/1990 | Davis et al. | 437/100 |
| 4,945,394 | 7/1990 | Palmour et al. . | |
| 5,170,231 | 12/1992 | Fujii et al. | 437/100 |
| 5,233,215 | 8/1993 | Baliga . | |
| 5,242,845 | 9/1993 | Baba et al. | 437/203 |
| 5,323,040 | 6/1994 | Baliga . | |
| 5,389,799 | 2/1995 | Uemoto . | |
| 5,399,515 | 3/1995 | Davis et al. | 437/100 |
| 5,501,173 | 3/1996 | Burk, Jr. et al. | 438/931 |
| 5,506,421 | 4/1996 | Palmour . | |
| 5,514,604 | 5/1996 | Brown | 438/931 |

FOREIGN PATENT DOCUMENTS

| | | |
|---|---|---|
| 61 48934 | 3/1986 | Japan . |
| 4-239778 | 8/1992 | Japan . |
| 5-102497 | 4/1993 | Japan . |
| 5-226326 | 9/1993 | Japan . |
| 9326047 | 12/1993 | WIPO . |

OTHER PUBLICATIONS

A. Suzuki et al., "Thermal Oxidation of SiC and Electrical Properties of Al–SiO2–SiC MOS Structure", Japanese Journal of Applied Physics, Vol. 21, No. 4, pp. 579–585, Apr. 1982.

John W. Palmour, "6H–Silicon Carbide Power Devices for Aerospace Application", IECEC–93 Aug. 8–13, 1993.

J.W. Palmour et al., "Vertical Power Devices in Silicon Carbide", Inst. Phys. Conf. Ser No. 137 Chapt. 6, 5th SiC and Related Mater. Conf. Wash. D.C. 1993.

J.W. Palmour et al., Proceedings of 28th Intersociety Energy Conversion Engineering Conf., Aug. 1993 pp. 1.249–1.254.

A. Suzuki et al, "Thermal Oxidation of SiC and Electrical Properties of AL–SiO$_2$–Sic MOS Structure" Jap. Journ. of Applied Physics vol. 21, No. 4 Apr. 1982 pp. 579–585.

(List continued on next page.)

*Primary Examiner*—Brian Dutton
*Attorney, Agent, or Firm*—Cushman, Darby & Cushman, IP Group of Pillsbury Madison & Sutro LLP

[57] ABSTRACT

A groove is formed on the surface of a semiconductor substrate composed of silicon carbide and a first thermal oxidation film is formed by executing thermal oxidation on a damaged layer of groove inner walls. Then, the first thermal oxidation film is removed so that the damaged layer can be removed. Since a second thermal oxidation film is formed after the damaged layer is removed, the second thermal oxidation film is uniform. A silicon carbide semiconductor device can be achieved with less side etching because substantially a (0001) carbon face of a cubic system is chosen as the plane orientation of the semiconductor substrate.

16 Claims, 6 Drawing Sheets

OTHER PUBLICATIONS

UEDA, et al.: "A New Vertical Power MOSFET Structure with Extremely Reduced on-Resistance", IEEE Transactions on Electron Devices, vol. ed-32, No 1, Jan. 1985, pp. 2–6.

Hara et al., "Thermal Oxidation Characteristics of 6H–SiC and Field Effect Characteristics of Vertical $SiO_2$/6H–SiC Interface". Third Meeting Draft, SiC and Related Wide Gap Semiconductor Research, Oct. 27–28, 1994, p. 11.

Hiroyuki Matsunami, Progress in SiC epitaxy–present and future, Institutute of Physics Conference Ser. No. 137: Chapter 1, 1993, pp. 45–50.

Norihito Tokura, Current–Voltage and Capacitance–Voltage Characteristics of Metal/Oxide/6H–Silicon Carbide Structure, Jpn. J. Appl. Phys. Vol. 34 (1995), pp. 5567–5573.

Properties and Specifications for 6H–Silicon Carbide, Cree Research, Inc., Oct., 1995.

Properties and Specifications for 4H–Silicon Carbide, Cree Research, Inc., Oct. 1995.

METHOD OF MANUFACTURING SIC SEMICONDUCTOR DEVICE HAVING DOUBLE OXIDE FILM FORMATION TO REDUCE FILM DEFECTS

CROSS REFERENCE TO RELATED APPLICATION

This is a continuation of application Ser. No. 08/468,073, filed on Jun. 6, 1995, which was abandoned upon the filing hereof.

This application is based upon and claims the benefit of priority of the prior Japanese Patent application No. 6-141393 filed on Jun. 23, 1994, the contents of which are incorporated herein by reference.

BACKGROUND OF THE INVENTION

1. Field of the Invention

The present invention relates to a method of manufacturing a silicon carbide semiconductor device. The method is suitable as a manufacturing method of, for example, an insulated gate type of electric field effect transistor, specifically a high power vertical type of MOSFET.

2. Description of Prior Art

Recently, a vertical type of power MOSFET using silicon carbide single crystal material is proposed as a power transistor. In order to reduce the loss of the power transistor, it is necessary to reduce its ON resistance. A groove gate type of power MOSFET shown in FIG. 13 is proposed as a device structure which can effectively reduce the ON resistance (Japanese Patent Application Laid Open No. 4-239778). In the groove gate type of power MOSFET of FIG. 13, a first semiconductor region 31 is formed on a substrate 30 made of silicon carbide, a second semiconductor region 33 is formed on the first semiconductor region 31, and further a third semiconductor region 33 is formed in a predetermined region of the second semiconductor region 32. A groove portion 34 is formed to penetrate the third semiconductor region 33 and the second semiconductor region 32 to the first semiconductor region 31 and the groove portion 34 is occupied by a gate 36 via a gate insulation film 35. An insulating film 37 is formed on the gate 36 and an electrode film 38 is formed on the third semiconductor region 33 including the insulation film 37.

Here, in a case of manufacturing the groove gate type of power MOSFET as shown in FIG. 13, the basic structure of a groove gate portion is completed by oxidizing the surface of the groove portion 34 through thermal oxidization to form the gate insulating film 35 on side walls and a bottom surface after the groove portion 34 is formed, and then by forming the gate electrode (gate 36).

However, in a case of manufacturing a groove gate type of power MOSFET as shown in FIG. 13, a damaged layer is formed on the inner walls of the groove because the inner walls of the groove gate portion are formed through anisotropic etching by use of a dry etching method, more specifically, a reactive ion etching (RIE) method. This is because there is at present no etching solution which can effectively etch the silicon carbide substrate and therefore it is most practical to etch using the dry etching method. Here, the damaged layer denotes a layer which has crystal defects formed in the physically etching with ions as in the RIE method, or an irregular layer which is formed as a result that a surface is uniformly etched in etching by use of a chemical etching method. In this damaged layer, the MOS interface characteristic is degraded and there is an increase of ON resistance and degradation of switching characteristic.

It could be considered that the surface wet etches uniformly to remove the damaged layer of the inner walls of the groove. However, there is a problem in that it is very difficult to uniformly remove the damaged layer in the wet etching as is well known.

Further, since a corner portion of the groove bottom portion is formed through anisotropic etching, an electric field is concentrated at the corner portion of the groove bottom portion. For this reason, a break down voltage between a gate and a drain is reduced. It could be considered that etching with weak anisotropic characteristic is performed or the corner portion is subjected to thermal oxidization for rounding the corner. However, there is a problem in that it is difficult to perform a fine process on the groove because the etching with weak anisotropic characteristic gradually spreads the side walls of the groove, i.e., a so-called side etching is caused. In a case of thermal oxidization, there is another problem in that it is difficult to control the thickness of a thermal oxidization film because dependency of a thermal oxidization rate upon a plane orientation is not clear in silicon carbide.

SUMMARY OF THE INVENTION

Therefore, an object of the present invention is to provide a method of manufacturing a silicon carbide semiconductor device in which the MOS interface characteristic is improved by removing a damaged layer on inner walls of a groove and which has a superior switching characteristic and a low ON resistance.

Another object of the present invention is to provide a method of manufacturing a silicon carbide semiconductor device in which a break down voltage is improved by rounding an edge portion of a corner on a bottom surface of a groove and which has less side etching.

In order to achieve the first object, a manufacturing method, according to the present invention, of a silicon carbide semiconductor device includes the following steps: a step of forming a groove on the surface of a semiconductor substrate composed of silicon carbide; a step of forming a first thermal oxidation film on inner walls of the groove; a step of removing the first thermal oxidation film by means of etching; and a step of forming a second thermal oxidation film on inner walls of the groove after removal of the first thermal oxidation film.

More specifically, a silicon carbide semiconductor device may be preferably formed as follows: a semiconductor substrate composed of single crystal silicon carbide, which is constituted of a low resistance layer of a first conductivity type and a high resistance layer of the first conductivity type disposed on the low resistance layer, is prepared; a semiconductor layer composed of silicon carbide of a second conductivity type is disposed on an upper surface of the high resistance layer; a semiconductor region of the first conductivity type is formed in a predetermined region of the semiconductor layer; a groove, which penetrates the semiconductor region and the semiconductor layer and reaches the high resistance layer of the first conductivity type, is formed; a first thermal oxidation film is formed on inner surfaces of the groove; the first thermal oxidation film is etched off; a second thermal oxidation film is formed on the inner surfaces of the groove after the first thermal oxidation film is etched; a gate electrode layer is formed on the second thermal oxidation film; a first electrode layer is formed so as to contact both the semiconductor layer and the semiconductor region; and a second electrode layer is formed on a lower surface of the low resistance layer.

Generally, when a groove is formed is on the surface of a silicon carbide semiconductor substrate, a damaged layer is formed on inner walls of the groove. According to the present invention, a first thermal oxidation film is formed by executing thermal oxidization of the damaged layer. Then, the first thermal oxidation film is etched to remove an irregular portion and a layer having crystal defects in the damaged layer. In this manner, the inner walls are flattened. Therefore, the second thermal oxidation film can be formed with a uniform thermal oxidization rate.

In a case where the present invention is applied to a manufacturing method of vertical type MOS transistor as described above, the first thermal oxidation film is formed in the groove and the first thermal oxidation film is removed so that the damaged layer can be effectively removed from the side surfaces of the groove in which a channel section is formed. Therefore, when a channel is formed on the surface of the semiconductor layer of the second conductivity type on the side surfaces of the groove to flow current between a source and a drain, the MOS interface characteristic is improved and the silicon carbide semiconductor device can be manufactured to have a superior switching characteristic and a low ON resistance. Further, the edge at the corner of the groove bottom surface is rounded and therefore a break down voltage between the gate and the drain is improved.

In order to achieve the second object, in the above manufacturing method of a silicon carbide semiconductor device, the plane orientation of the surface of the semiconductor substrate composed of silicon carbide is set to be substantially one of a (0001) carbon face of a hexagonal system and a {111} carbon face of a cubic system, and the plane orientation of the bottom surface of the groove is set to be substantially the same as that of the semiconductor substrate.

It was found by the inventors that the (0001) carbon face of a hexagonal system or the {111} carbon face of a cubic system has a great thermal oxidization rate compared to that of the other plane. Therefore, through the thermal oxidization, a thin oxidation film and a thick oxidation film are formed on the groove side walls and the groove bottom surface, respectively. By removing these thermal oxidation films, the groove inner walls can be etched with less side etching. Therefore, an amount of side etching can be reduced with a simple manufacturing method, resulting in possible fine processing.

Further, the step of forming a groove may comprise a steps of forming a local thermal oxidation film having a predetermined depth from the surface of the semiconductor layer in the groove forming region; and a step of removing the local thermal oxidation film. In this manner, at the same time when the groove is formed, the damaged layer on the groove inner walls can be removed in advance before the step of forming the first thermal oxidation film. Therefore, according to this, the damaged layer can be more effectively removed. That is to say, the damaged layer on the groove inner walls is further reduced, a superior MOS interface characteristic, a superior ON resistance and a superior break down voltage between the gate and the source can be obtained.

In addition, the step of forming a groove may include a step of forming the groove to have a predetermined depth from the surface of the semiconductor layer and to have the side surfaces thereof perpendicular to the surface of the semiconductor layer.

As described in detail, according to the present invention, the damaged layer can be removed by etching the groove inner walls of silicon carbide. Further, a method of manufacturing the silicon carbide semiconductor device can be provided which can be readily manufactured, has no damaged layer on the groove inner walls, has a superior MOS interface characteristic, and has a high break down voltage between the gate and the source because the edge portion of the groove bottom surface is rounded.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

First Embodiment

An embodiment of the present invention will be described below with reference to the accompanying drawings.

Figure 1:
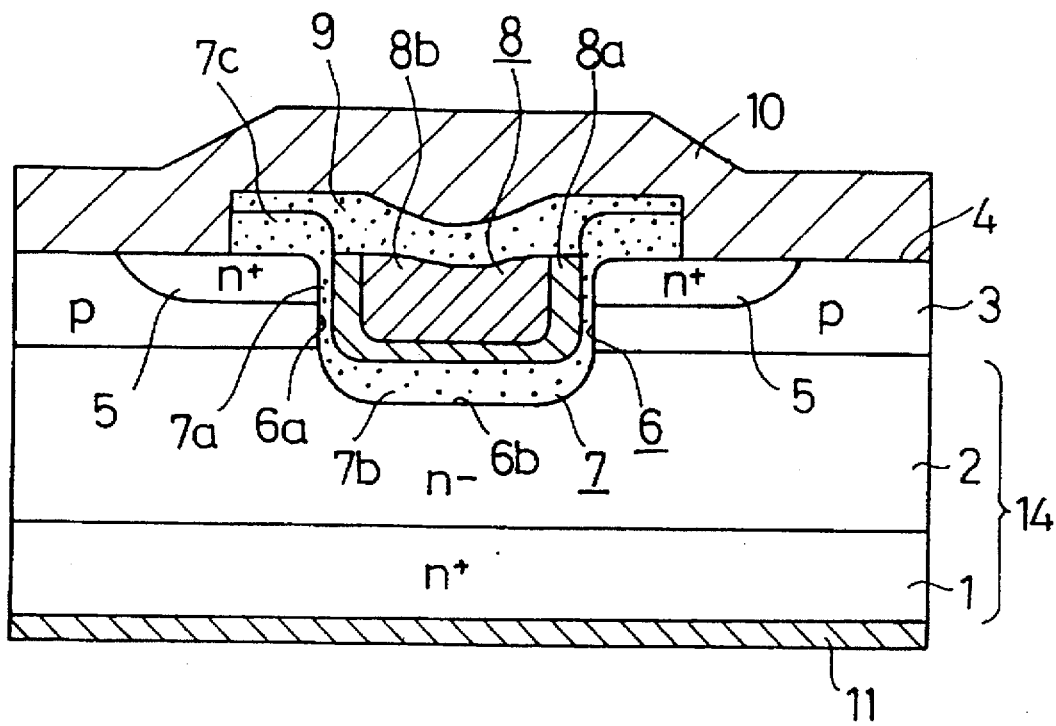
FIG. 1 is a cross sectional view showing a silicon carbide semiconductor device according to a first embodiment of the present invention.

FIG. 1 is a cross section view showing a groove gate type of power MOSFET (a vertical type of power MOSFET) according to the embodiment of the present invention.

A substrate 1 composed of n$^+$-type single crystal silicon carbide (to be also referred to as "SIC" hereinafter) as a low resistance layer has substantially a (0001) carbon surface in a hexagonal system of SiC and a low resistance and a carrier density of about $5 \times 10^{18}$ cm$^{-3}$. An n$^-$-type epitaxial layer 2 as a high resistance layer and a p-type epitaxial layer 3 are sequentially laminated on the n$^+$-type single crystal SiC substrate 1. The n$^-$-type epitaxial layer 2 has a carrier density of about $1 \times 10^{16}$ cm$^{-3}$ and a thickness of about 10 μm while the p-type epitaxial layer 3 has a carrier density of about $1 \times 10^{17}$ cm$^{-3}$ and a thickness of about 2 μm. The surface 4 of the p-type epitaxial layer 3 is a device surface.

In the embodiment, a semiconductor substrate is composed of the n$^+$-type single crystal SiC substrate 1 and the n$^-$-type epitaxial layer 2. An n$^+$-type source region 5 is formed in a predetermined region on the surface 4 of the p-type epitaxial layer 3 as a semiconductor region. The n$^+$-type source region 5 has a carrier density of about $1 \times 10^{19}$ cm$^{-3}$ and a junction depth of about 0.5 μm. Further, a groove 6 is formed on a predetermined position on the surface 4 of the p-type epitaxial layer 3. The groove 6 penetrates the n$^+$-type source region 5 and the p-type epitaxial layer 3 to the n$^-$-type epitaxial layer 2 and has side walls 6a perpendicular to the surface of the p-type epitaxial layer 3 and a bottom surface 6b parallel to the surface of the p-type epitaxial layer 3.

A gate electrode layer 8 is provided through a gate thermal oxidation film 7 as a gate insulation film in the groove 6. The inner wall of the groove 6 is subjected to thermal oxidation for about 5 hours at 1,100° C. and etching of the resultant thermal oxidation film. Thereby, a damaged layer is removed from the inner wall of the groove 6 and the groove 6 is made round at the corner thereof. Subsequently, the gate thermal oxidation film 7 is formed through a single thermal oxidation process of about 5 hours at 1,100° C. so that the gate thermal oxidation film 7 has a thin gate thermal oxidation film 7a of 50 nm in thickness on the side walls 6a of the groove 6 and a thickness gate thermal oxidation film 7b of 500 nm in thick on the bottom surface 6b of the groove 6. Further, the gate thermal oxidation film 7 is also formed on the n$^+$-type source region 5 so that a gate thermal oxidation film 7c has a thickness of about 500 nm in this region. This is because the (0001) carbon surface of the hexagonal system and a {111} carbon surface of a cubic system has a thermal oxidation rate greater than the other surfaces. As a result, the thin oxide film and the thick oxide film are formed on the groove side walls and the groove bottom surface, respectively.

The gate electrode layer 8 is composed of a first polysilicon layer 8a in which phosphor is doped and which is in contact with the gate thermal oxidation film 7 and a second polysilicon layer 8b on the first polysilicon layer 8a. An interlayer insulation layer 9 of about 1 μm in thickness is provided on the gate electrode layer 8. Further, a source electrode layer 10 is disposed as a first electrode layer on the surface of the n$^+$-type source region 5 and the surface of the p-type epitaxial layer 3, including the interlayer insulation film 9 and is contact with the n$^+$-type source region 5 and p-type epitaxial layer 3. A drain electrode layer 11 as a second electrode layer contacting the n$^+$-type single crystal SiC substrate 1 is formed on the rear surface of the substrate 1.

Next, the manufacturing process of the groove gate type of power MOSFET will be described below with reference to FIGS. 2 to 8.

Figure 2:
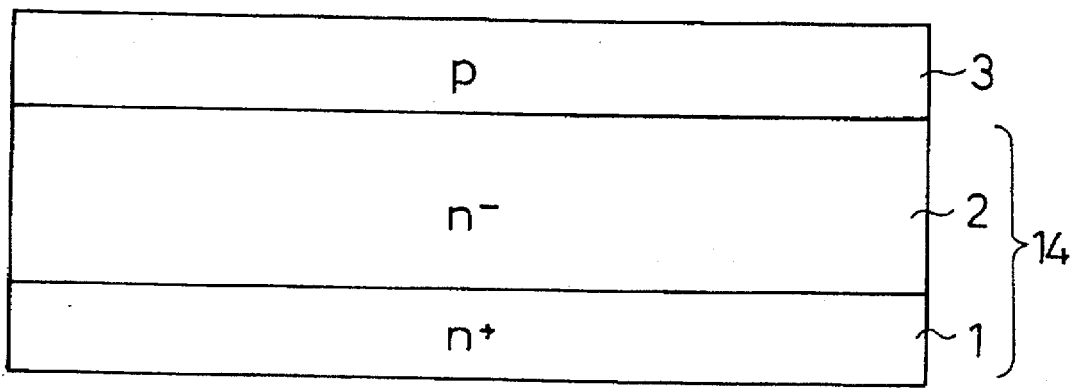
FIG. 2 is a cross sectional view for explaining a manufacturing process of the silicon carbide semiconductor device shown in FIG. 1.

First, as shown in FIG. 2, n$^+$-type single crystal SiC substrate 1 having substantially the (0001) carbon surface for a plane orientation and a low resistance is prepared. The n$^-$-type epitaxial layer 2 is formed on the surface of the n$^+$-type single crystal SiC substrate 1 to have the carrier density of about $1 \times 10^{16}$ cm$^{-3}$ and a thickness of about 10 μm and then the p-type epitaxial layer 3 is laminated on the n$^-$-type epitaxial layer 2 to have the carrier density of about $1 \times 10^{17}$ cm$^{-3}$ and a thickness of about 2 μm. In this manner, the semiconductor substrate 14 is formed of the n$^+$-type single crystal SiC substrate 1 and the n$^-$-type epitaxial layer 2.

Figure 3:
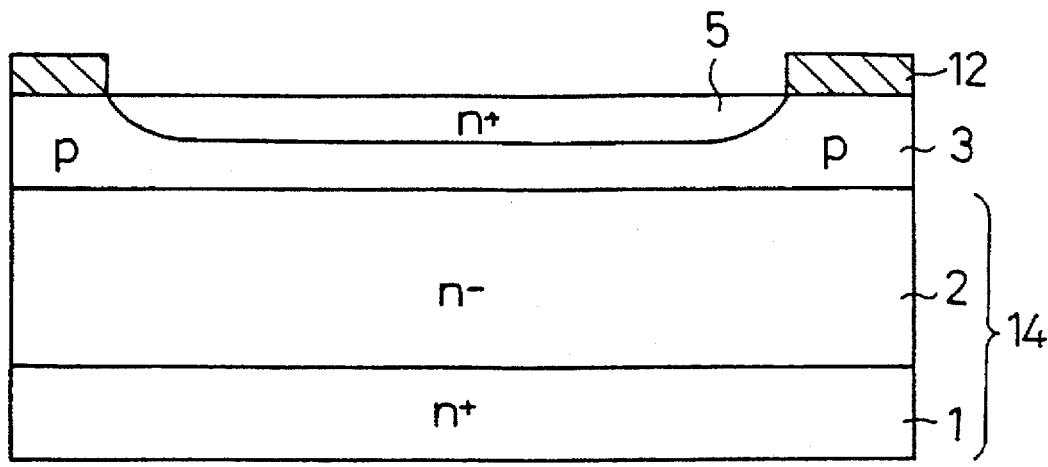
FIG. 3 is a cross sectional view for explaining a manufacturing process of the silicon carbide semiconductor device shown in FIG. 1.

Subsequently, as shown in FIG. 3, the n$^+$-type source region 5 is formed to have the surface carrier density of about $1 \times 10^{19}$ cm$^{-3}$ and the junction depth of about 0.5 μm by an ion injection method, using a mask member 12 over the p-type epitaxial layer 3.

Figure 4:
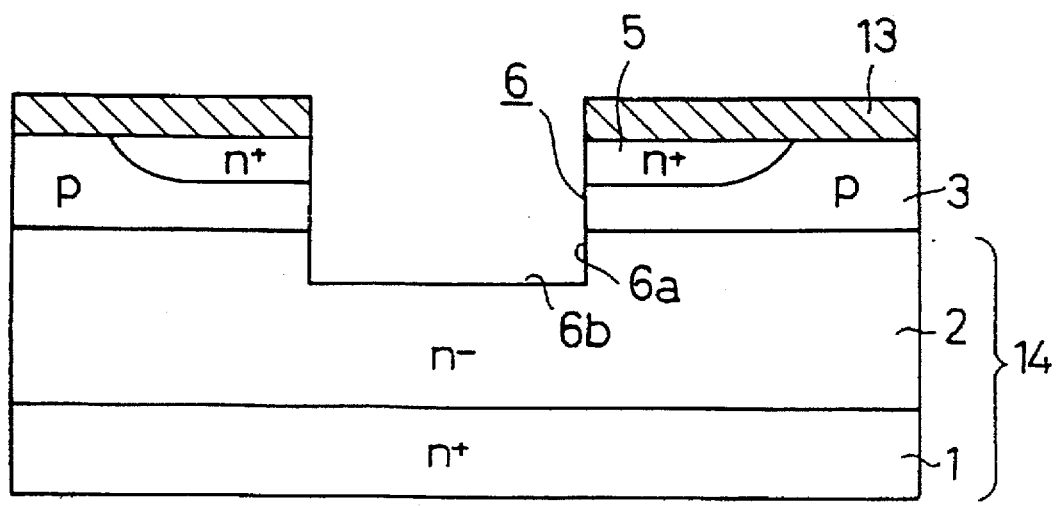
FIG. 4 is a cross sectional view for explaining a manufacturing process of the silicon carbide semiconductor device shown in FIG. 1.

Next, after the mask member 12 is removed, the groove 6 is formed to penetrate the n$^+$-type source region 5 and the p-type epitaxial layer 3 to the n$^-$-type epitaxial layer 2 by a reactive ion etching (RIE) method using a mask member 13 as shown in FIG. 4. The groove 6 has the side walls 6a perpendicular to the surface of the p-type epitaxial layer 3 and the bottom surface 6b parallel to the surface of the p-type epitaxial layer 3.

Figure 5:
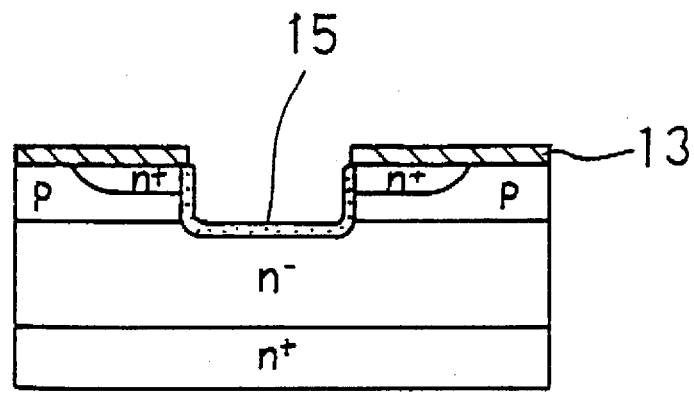
FIG. 5 is a cross sectional view for explaining a manufacturing process of the silicon carbide semiconductor device shown in FIG. 1.
Figure 6:
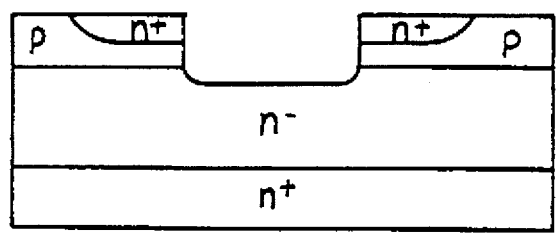
FIG. 6 is a cross sectional view for explaining a manufacturing process of the silicon carbide semiconductor device shown in FIG. 1.

Then, the thermal oxidation film 15 is formed on the groove inner walls through a thermal oxidation process of 5 hours at 1,100° C. as the first thermal oxidation film, as shown in FIG. 5. The damaged layer formed due to the RIE method is oxidized through the thermal oxidation so that the thermal oxidation film of about 50 nm in thickness and the thermal oxidation film 15 of about 500 nm in thickness are formed the side walls 6a and bottom surface 6b of the groove 6, respectively. Thereafter, after the thermal oxidation film 15 is removed using hydrofluoric acid, the mask member 13 is also removed, as shown in FIG. 6. The damaged layer is removed from the inner wall of the groove 6 by removing the thermal oxidation film 15.

Figure 7:
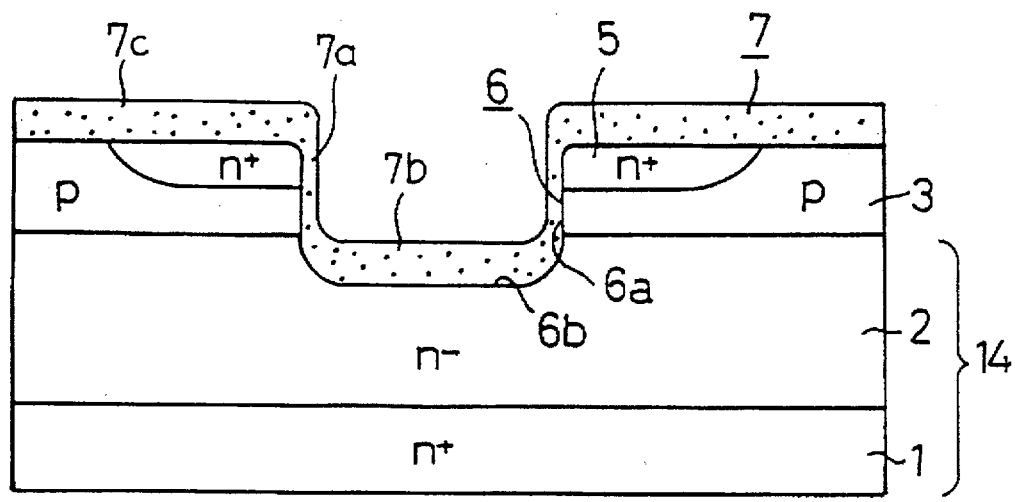
FIG. 7 is a cross sectional view for explaining a manufacturing process of the silicon carbide semiconductor device shown in FIG. 1.

Subsequently, as shown in FIG. 7, the gate thermal oxidation film 7 is formed through a single thermal oxidation process of about 5 hours at 1,100° C. so that the gate thermal oxidation film 7 has a thin gate thermal oxidation film 7a of 50 nm in thickness on the side walls 6a of the groove 6 and a thickness gate thermal oxidation film 7b of 500 nm in thick on the bottom surface 6b of the groove 6. Further, the gate thermal oxidation film 7c is also formed on the n$^+$-type source region 5 to have a thickness of about 500 nm.

Figure 8:
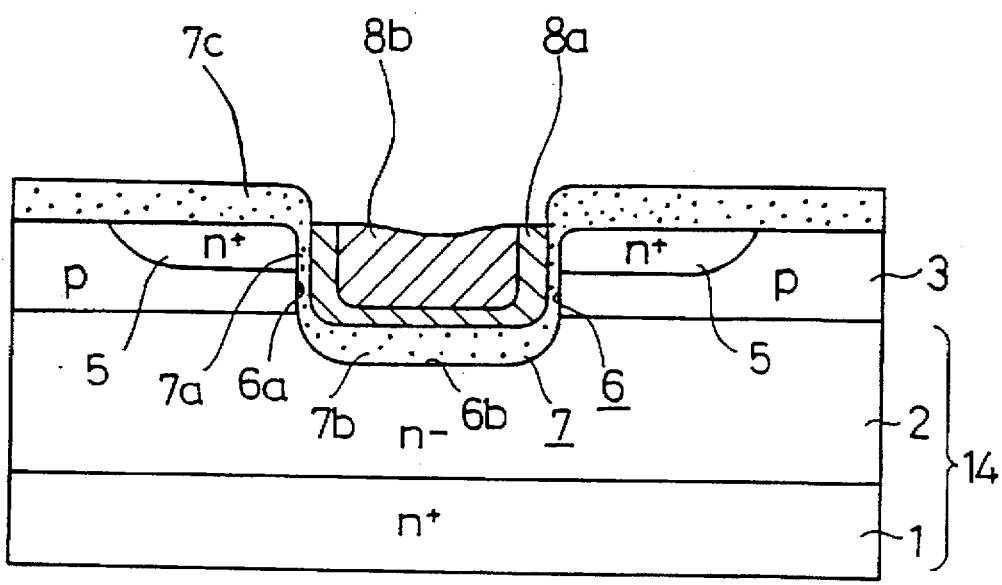
FIG. 8 is a cross sectional view for explaining a manufacturing process of the silicon carbide semiconductor device shown in FIG. 1.

Subsequently, the groove 6 is sequentially filled with the first and second polysilicon layers 8a and 8b, as shown in FIG. 8.

Thereafter, the interlayer insulation film 9 is formed by a CVD method on the gate thermal oxidation film 7 including the first and second polysilicon layers 8a and 8b, as shown in FIG. 1. Then, the gate thermal oxidation film 7 and the interlayer insulation film 9 are removed from a portion of the n$^+$-type source region 5 for a source contact to be formed and a surface portion of the p-type epitaxial layer 3. Next, the source electrode layer 10 is formed on the n$^+$-type source region 5, the p-type epitaxial layer 3, and the interlayer insulation film 9. Further, the drain electrode layer 11 is formed on the rear surface of the n$^+$-type single crystal SiC substrate 1. As a result, the groove gate type of power MOSFET is completed.

In this manner, the groove gate type of power MOSFET according to the present embodiment comprises the semiconductor substrate 14 comprising single crystal silicon carbide of a hexagonal system is composed of the n$^+$-type single crystal SiC substrate 1 (a first conductivity type of low resistance layer) and the n$^-$-type epitaxial layer 2 (a first conductivity type of high resistance layer) formed on the n$^+$-type single crystal SiC substrate 1 with substantially a (0001) carbon surface as the plane orientation of the n$^-$-type epitaxial layer 2, the p-type epitaxial layer 3 (a second conductivity type of semiconductor layer) formed on the semiconductor substrate 14, having substantially the (0001) carbon surface as a plane orientation, and composed of a single crystal silicon carbide of the hexagonal system, and the n$^+$-type source region (the first conductivity type of semiconductor region) formed in the predetermined region of the p-type epitaxial layer 3. The groove is formed to penetrate the n$^+$-type source region 5 and the p-type epitaxial layer 3 to the n$^-$-type epitaxial layer 2 and have the side walls 6a perpendicular to the surface of the p-type epitaxial layer 3 and the bottom surface 6b parallel to the surface of the p-type epitaxial layer 3 such that the groove 6 has no damage layer on the inner wall and the rounded corner portion. The MOSFET further comprises the gate thermal oxidation film 7 formed as a gate insulating film such that the thickness on the bottom surface 6b of the groove 6 is thicker than that on the side walls 6a of the groove 6, the gate electrode layer 8 formed inside the gate thermal oxidation film 7 in the groove 6, the source electrode layer 10 (the first electrode layer) formed on the p-type epitaxial layer 3 surface and the n$^+$-type source region 5 surface, and the drain electrode layer 11 (the second electrode layer) formed on the rear surface of the semiconductor substrate.

Accordingly, the surface of p-type epitaxial layer 3 on the side walls 6a of the groove 6 becomes a channel. In a case that current flows between the source and the drain, the MOS interface characteristic can be improved because the damaged layer is removed in the inner walls of the groove and a break down voltage between the gate and the drain can be also improved because the corner portion at the bottom surface portion of the groove is rounded. Further, a threshold voltage can be reduced (for example, 2 V) because the gate thermal oxidation film 7a of the side walls 6a of the groove 6 is thin. Moreover, since the gate thermal oxidation film 7b on the bottom surface 6b of the groove 6 is thick, not only the break down voltage between the gate and the drain can be increased (for example, 500 V or above) but also stray capacitance can be reduced, resulting in realizing a high speed operation. As a result, the manufacturing cost can be reduced and the yield can be improved.

Note that the side walls of the groove are perpendicular to the semiconductor surface in the above first embodiment. However, the present invention is not limited to this, and the side walls of the groove may have any inclined angle. In this case, the same advantages can be obtained.

Second Embodiment

The second embodiment of the present invention will be described below with reference to the accompanying figures.

The manufacturing method in the second embodiment is different from that in the first embodiment in a groove forming process. Only the groove forming process will be described in detail with reference to FIGS. 9 to 12.

Figure 9:
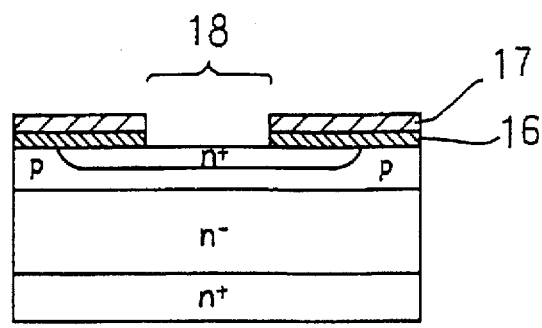
FIG. 9 is a cross sectional view for explaining a manufacturing process of the silicon carbide semiconductor device according to a second embodiment of the present invention.

In the second embodiment, after the n$^+$-type source region is formed as shown in FIG. 3 in the first embodiment, an oxidization resistive film 16 such as a Si$_3$N$_4$ film of about 200 nm is formed as shown in FIG. 9 and the oxidization resistive film 16 in the groove forming region 18 is removed with dry etching by using a mask member 17.

Figure 10:
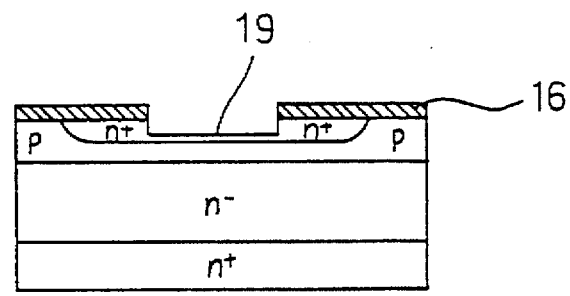
FIG. 10 is a cross sectional view for explaining a manufacturing process of the silicon carbide semiconductor device according to the second embodiment of the present invention.

Then, as shown in FIG. 10, after a groove 19 of 1 μm in deep is formed with dry etching, the mask member 17 is removed.

Figure 11:
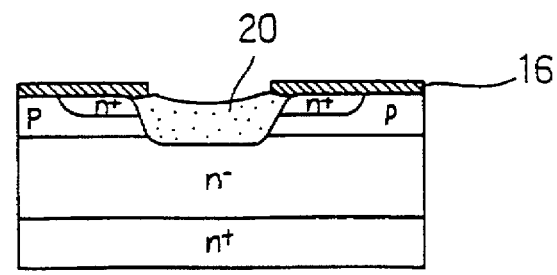
FIG. 11 is a cross sectional view for explaining a manufacturing process of the silicon carbide semiconductor device according to the second embodiment of the present invention.

Subsequently, as shown in FIG. 11, a thermal oxidation film 20 of 2 μm in thickness is formed in a local thermal oxidization process of 1,100° C. By this process the groove 21 having an inclined side wall is formed.

Figure 12:
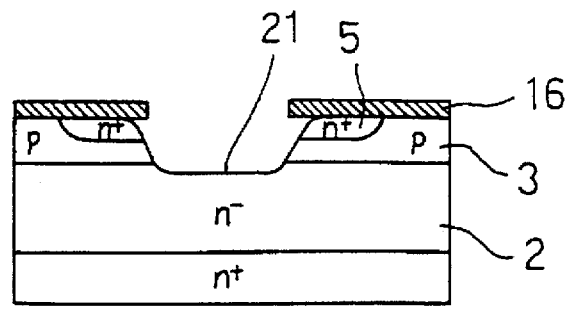
FIG. 12 is a cross sectional view for explaining a manufacturing process of the silicon carbide semiconductor device according to the second embodiment of the present invention.
Figure 13:
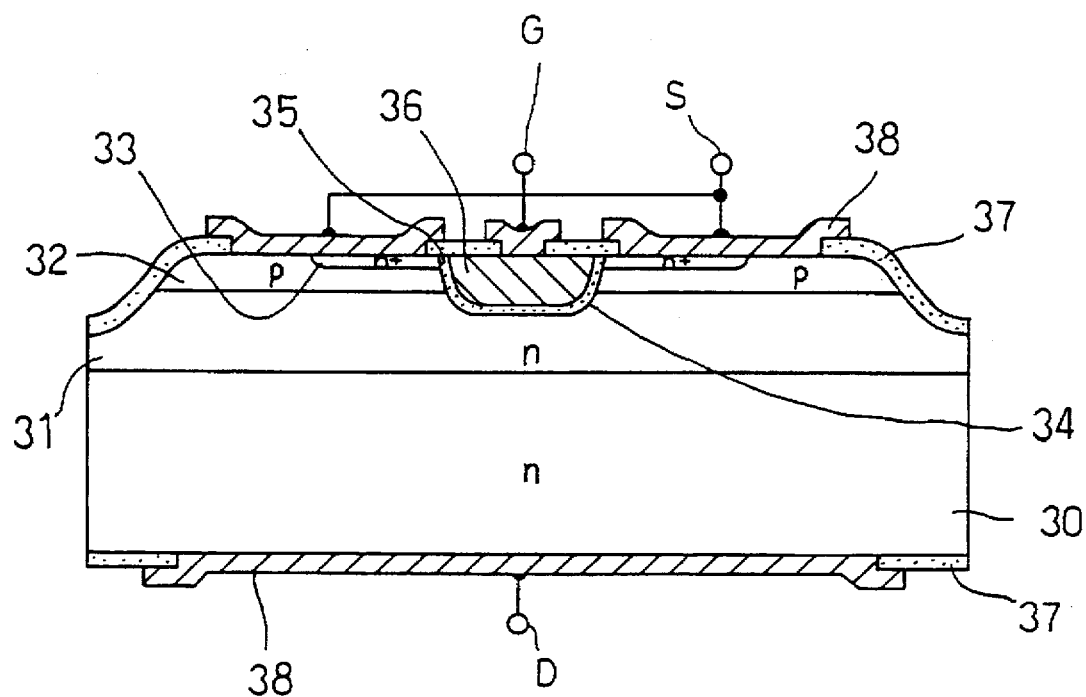
FIG. 13 is a cross sectional view showing a conventional silicon carbide semiconductor device.

Thereafter, as shown in FIG. 12, by removing the thermal oxidization film 20 with hydrofluoric acid, the groove 21 is formed to have a depth of about 2 μm with no damage and an inclined wall and to penetrate the n$^+$-type source region 5 and the p-type epitaxial layer 3 to the n$^-$-type epitaxial layer 2.

After the groove is formed in this manner, the manufacturing process goes to FIG. 5 in the first embodiment.

Note that in the second embodiment, it is not always necessary to form the groove 19 before the local thermal oxidization and a desired depth of the groove 21 may be obtained only with the local thermal oxidization.

Note that the present invention is not limited to the above first and second embodiments. For instance, although the description is given only on the n-channel type, it would be not necessary to say that the same advantages are achieved in the p-channel type in which the n-type semiconductor and the p-type semiconductor are exchanged. Further, the film thickness of the thermal oxidization film is also not limited to the thickness in the embodiments (the side wall of about 50 nm and the bottom surface of about 500 nm), any structure may be used if the thickness on the bottom surface is thicker than that on the side wall. Furthermore, the rounding of the corner portion may be performed by executing thermal oxidization and thermal oxidation film removal not once but plural times. The plane orientation of the semiconductor substrate is not limited to the substantially (0001) carbon face of the hexagonal system as in the embodiments and may be a substantially (111) carbon face of a cubic system.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method of manufacturing a silicon carbide semiconductor device comprising the steps of:

forming an epitaxial layer on a silicon carbide semiconductor substrate;

forming a groove having a bottom surface and side surfaces on the surface of said epitaxial layer by means of dry etching;

forming a first thermal oxidation film on said bottom surface and said side surfaces of said groove;

removing said first thermal oxidation film by means of wet etching; and forming a second thermal oxidation film on said bottom surface and said side surfaces of said groove after said removal of said first thermal oxidation film;

wherein the plane orientation of said semiconductor substrate composed of silicon carbide is one of a (0001) carbon face of a hexagonal system and a {111} carbon face of a cubic system, and wherein the plane orientation of said bottom surface of said groove in said step of forming a groove is substantially the same as that of said semiconductor substrate; and said second thermal oxidation film comprises a side surface oxidation film formed on said side surfaces of said groove and a bottom surface oxidation film having a thickness thicker than that of said side surface oxidation film and formed on said bottom surface of said groove.

2. The method of manufacturing a silicon carbide semiconductor device according to claim 1, wherein said step of forming a second thermal oxidation film includes simultaneously forming said side surface oxidation film and said bottom surface oxidation film.

3. The method of manufacturing a silicon carbide semiconductor device according to claim 1, wherein said side surfaces of said groove in said step of forming a groove are substantially perpendicular to the surface of said semiconductor substrate.

4. The method of manufacturing a silicon carbide semiconductor device according to claim 1, wherein surface regions of said bottom and side surfaces of said groove in said step of forming a groove include lattice defects, respectively, and wherein said step of forming a first thermal oxidation film includes forming said first thermal oxidation film having a thickness of said surface region including said lattice defects at least.

5. A method of manufacturing a silicon carbide semiconductor device comprising the steps of:

preparing a semiconductor substrate composed of single crystal silicon carbide which is constituted of a first resistance layer of a first conductivity type and having a first resistance and a second resistance layer of the first conductivity type, formed on said first resistance layer and having a second resistance less than said first resistance, and forming a semiconductor layer composed of silicon carbide of a second conductivity type on an upper surface of said semiconductor substrate;

forming a semiconductor region of the first conductivity type in a region of said semiconductor layer;

forming a groove to penetrate said semiconductor region and said semiconductor layer and to reach said second resistance layer of the first conductivity type;

forming a first thermal oxidation film on inner surfaces of said groove;

removing said first thermal oxidation film by means of etching;

forming a second thermal oxidation film on said inner surfaces of said groove after said removing step; and forming a gate electrode layer on said second thermal oxidation film, a first electrode layer so as to contact both said semiconductor layer and said semiconductor region, and a second electrode layer on a lower surface of said semiconductor substrate to contact said first resistance layer;

wherein the plane orientation of said upper surface of said semiconductor substrate composed of silicon carbide is one of a (0001) carbon face of a hexagonal system and a {111} carbon face of a cubic system, and wherein the plane orientation of said bottom surface of said groove in said step of forming a groove is substantially the same as that of said semiconductor substrate; and said second thermal oxidation film comprises a side surface oxidation film formed on said side surfaces of said groove and a bottom surface oxidation film having a thickness thicker than that of said side surface oxidation film an formed on said bottom surface of said groove.

6. The method of manufacturing a silicon carbide semiconductor device according to claims 5, wherein said step of forming a groove comprises the steps of:

forming a local thermal oxidation film having a predetermined depth from the surface of said semiconductor layer in said groove forming region; and removing said local thermal oxidation film.

7. The method of manufacturing a silicon carbide semiconductor device according to claim 5, wherein said step of forming a groove includes a step of forming said groove to have said side surfaces perpendicular to the surface of said semiconductor layer.

8. The method of manufacturing a silicon carbide semiconductor device according to claim 5, wherein said step of forming a groove comprises the steps of:

forming a local thermal oxidation film in said groove forming region; and removing said local thermal oxidation film.

9. A method of manufacturing a silicon carbide semiconductor device comprising the steps of:

forming an epitaxial layer on a silicon carbide semiconductor substrate;

forming a groove having a bottom surface and side surfaces on the surface of said epitaxial layer by means of dry etching;

forming a first thermal oxidation film on said bottom surface and said side surfaces of said groove;

removing said first thermal oxidation film by means of wet etching; and forming a second thermal oxidation film on said bottom surface and said side surfaces of said groove after said removal of said first thermal oxidation film;

wherein the plane orientation of said semiconductor substrate composed of silicon carbide is one of a substantially (0001) carbon face of a hexagonal system and a substantially {111} carbon face of a cubic system, and wherein the plane orientation of said bottom surface of said groove in said step of forming a groove is substantially the same as that of said semiconductor substrate; and said second thermal oxidation film comprises a side surface oxidation film formed on said side surfaces of said groove and a bottom surface oxidation film having a thickness thicker than that of said side surface oxidation film and formed on said bottom surface of said groove.

10. The method of manufacturing a silicon carbide semiconductor device according to claim 9, wherein said step of forming a second thermal oxidation film includes simultaneously forming said side surface oxidation film and said bottom surface oxidation film.

11. The method of manufacturing a silicon carbide semiconductor device according to claim 9, wherein said side surfaces of said groove in said step of forming a groove is substantially perpendicular to the surface of said semiconductor substrate.

12. A method of manufacturing a silicon carbide semiconductor device according to claim 9, wherein surface regions of said bottom and side surfaces of said groove in said step of forming a groove include lattice defects, respectively, and wherein said step of forming a first thermal oxidation film includes forming said first thermal oxidation film having a thickness of said surface region including said lattice defects at least.

13. The method of manufacturing a silicon carbide semiconductor device according to claim 9, wherein said step of forming a groove comprises the steps of:

forming a local thermal oxidation film in said groove forming region; and removing said local thermal oxidation film.

14. A method of manufacturing a silicon carbide semiconductor device comprising the steps of:

preparing a semiconductor substrate composed of single crystal silicon carbide which is constituted of a first resistance layer of a first conductivity type and having a first resistance and a second resistance layer of the first conductivity type, formed on said first resistance layer and having a second resistance less than said first resistance, and forming a semiconductor layer composed of silicon carbide of a second conductivity type on an upper surface of said semiconductor substrate;

forming a semiconductor region of the first conductivity type in a region of said semiconductor layer;

forming a groove to penetrate said semiconductor region and said semiconductor layer and to reach said second resistance layer of the first conductivity type;

forming a first thermal oxidation film on inner surfaces of said groove;

removing said first thermal oxidation film by means of etching;

forming a second thermal oxidation film on said inner surfaces of said groove after said removing step; and forming a gate electrode layer on said second thermal oxidation film, a first electrode layer so as to contact both said semiconductor layer and said semiconductor region, and a second electrode layer on a lower surface of said semiconductor substrate to contact said first resistance layer;

wherein the plane orientation of said upper surface of said semiconductor substrate composed of silicon carbide is one of a substantially (0001) carbon face of a hexagonal system and a substantially {111} carbon face of a cubic system, and wherein the plane orientation of said bottom surface of said groove in said step of forming a groove is substantially the same as that of said semiconductor substrate; and said second thermal oxidation film comprises a side surface oxidation film formed on said side surfaces of said groove and a bottom surface oxidation film having a thickness thicker than that of said side surface oxidation film an formed on said bottom surface of said groove.

15. The method of manufacturing a silicon carbide semiconductor device according to claim 14, wherein said step of forming a groove comprises the steps of:

forming a local thermal oxidation film having a predetermined depth from the surface of said semiconductor layer in said groove forming region; and removing said local thermal oxidation film.

16. The method of manufacturing a silicon carbide semiconductor device according to claim 14, wherein said step of forming a groove includes a step of forming said groove to have said side surfaces perpendicular to the surface of said semiconductor layer.

* * * * *